United States Patent
Mitsuhashi et al.

(10) Patent No.: US 6,194,023 B1
(45) Date of Patent: Feb. 27, 2001

(54) METHOD OF MANUFACTURING A POLY-CRYSTALLINE SILICON FILM

(75) Inventors: Hiroshi Mitsuhashi; Yuki Matsuura; Takashi Fujimura; Nobuo Imai; Yasumasa Goto, all of Saitama-ken (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/160,360

(22) Filed: Sep. 25, 1998

(30) Foreign Application Priority Data

Sep. 25, 1997 (JP) .................................................... 9-260316

(51) Int. Cl.⁷ ....................................................... B05D 3/06
(52) U.S. Cl. ............................... 427/8; 427/554; 427/555; 427/559; 438/798; 438/799
(58) Field of Search .................... 427/8, 9, 10, 554, 427/558, 559; 438/798, 799, FOR 101

(56) References Cited

U.S. PATENT DOCUMENTS

| | | | |
|---|---|---|---|
| 4,309,225 | * 1/1982 | Fan et al. | 427/555 |
| 4,330,363 | * 5/1982 | Biegesen et al. | 117/43 |
| 4,466,179 | 8/1984 | Kasten . | |
| 4,536,231 | 8/1985 | Kasten . | |
| 4,589,951 | * 5/1986 | Kawamura | 117/43 |
| 5,372,836 | * 12/1994 | Imahashi et al. | 427/8 |
| 5,529,951 | * 6/1996 | Noguchi et al. | 438/487 |
| 5,766,989 | * 6/1998 | Naegawa et al. | 438/166 |
| 5,824,573 | * 10/1998 | Zhang et al. | 438/150 |
| 5,830,538 | * 11/1998 | Gates et al. | 427/553 |
| 6,059,873 | * 5/2000 | Yamaguchi et al. | 427/10 |
| 6,080,236 | * 6/2000 | McCulloch et al. | 427/8 |

FOREIGN PATENT DOCUMENTS

| | | |
|---|---|---|
| 64-76715 | 3/1989 | (JP) . |
| 2-177422 | 7/1990 | (JP) . |
| 3-286518 | 12/1991 | (JP) . |

* cited by examiner

Primary Examiner—Marianne Padgett
(74) Attorney, Agent, or Firm—Pillsbury Madison & Sutro LLP

(57) ABSTRACT

A method of manufacturing a poly-crystalline silicon (p-Si) film includes the steps in which an excimer laser anneals an amorphous silicon (a-Si) film deposited on a glass substrate and makes the same into the poly-crystalline silicon while the glass substrate is moved in a moving direction relative to the laser. Prior to carrying out the annealing step, a couple of the laser pulses are applied to different places of the a-Si film, provided that each of the laser pulses has different energy fluence and one pulse at a time is applied to the a-Si film. The pulse applied area is divided into two sections by a reference line perpendicular to the moving direction of the glass substrate. Average grain sizes of the p-Si film in the two sections are compared to each other to determine the moving direction.

7 Claims, 5 Drawing Sheets

METHOD OF MANUFACTURING A POLY-CRYSTALLINE SILICON FILM

BACKGROUND OF THE INVENTION

Field of the Invention

This invention relates to a method of making a poly-crystalline silicon semiconductor film from an amorphous silicon film and, more particularly, to a method of manufacturing a poly-crystalline silicon film in which laser pulses are applied to anneal an amorphous silicon film deposited on a glass substrate while the substrate or the laser beams are moved in a predetermined direction. The poly-crystalline silicon (p-Si) film is suitable for thin film transistors (TFTs), such as pixel switching and driver circuit TFTs used for a liquid crystal display device.

At the present, active-matrix type liquid crystal display devices are mass-produced. Such liquid crystal display devices, however, include amorphous silicon (a-Si) insulation-gate type TFTs. Since the mobility of electrons under electric fields ($\mu$FE) in a-Si TFTs is equal to or lower than 1 cm$^2$/Vs, the a-Si TFTs are not sufficient in capability for high resolution, high speed and high performance display devices. Poly-crystalline silicon (p-Si) TFTs, on the other hand, have been experimentally made by means of a laser annealing process in which excimer laser pulses are applied to anneal a-Si films and make the same into p-Si films for TFTS. The mobility of electrons under electric fields in such p-Si TFTs ranges from 100 cm$^2$/Vs to 200 cm$^2$/Vs. The p-Si TFTs are expected to be essential components for high resolution, high speed and sophisticated function (e.g., driver-circuit-integrated) display devices.

Such an annealing process is carried out by laser annealing equipment 50 shown in FIG. 4. The equipment 50 includes an excimer laser generator 51, an optical system module 52, an annealing chamber 54, a control apparatus 55, a substrate cassette station 56 and a manipulation robot 57. The excimer laser generator 51 generates a XeCl gas excimer laser 53 with the wavelength of 308 nm, for instance. As shown in FIG. 5, the laser 53 is applied to an a-Si film substrate 62 through a reflection mirror 61. The substrate 62 is moved in the direction 63 at a regular speed. The laser pulse beam size on the a-Si surface is 200 mm long and 0.4 mm wide, for instance. This pulse beam is oscillated at the frequency of 300 Hz. As a pulse applied region is gradually moved, the a-Si film in the region is successively poly-crystallized.

It is noted that a grain size (or diameter) of p-Si is a decisive factor of the mobility of electrons in p-Si TFTs under electric fields. The grain size mainly depends on energy density of the laser called energy fluence. The relationship between the grain size and the fluence is schematically shown in FIG. 6. Generally, the grain size becomes larger as the energy fluence is increased. However, the grain size is not changed even if the energy fluence is increased in value from F1 through F2. The grain size again becomes larger in response to the fluence increase in value from F2 through F3. The p-Si, however, is transformed into micro-crystalline silicon in the case where the fluence value is greater than F3. In such micro-crystalline silicon, the mobility of electrons under electric fields ($\mu$FE) decreases so that the micro-crystalline silicon does not provide desired TFT characteristics.

A checking technique for the grain size is to etch the p-Si in Secco's solution and to observe the etched grain with a scanning electron microscope. This technique is used to properly set the fluence in the middle of the region between F1 and F2 where the grain size is not substantially changed. Laser oscillation intensities are always changed. Nevertheless, where the laser annealing is carried out in that region, a uniform grain size of p-Si can be obtained regardless of such laser oscillation intensity changes.

The inventors of the present invention have discovered that the fluence range between F1 and F2 is determined in accordance with a moving direction of a glass substrate relative to the shorter axis of the laser beams, and that a uniform grain size of p-Si cannot be obtained from a laser annealing process in which such a moving direction is not properly selected.

As described above, the laser beam is 200 mm long and 0.4 mm wide. Its profile is shown in FIG. 7 in which the X- and Y-axes represent the width of the laser beam and the energy fluence of the laser beams, respectively. The fluence distribution is not constant but is declined slightly as shown. The laser beam scanning direction +X or -X is a moving direction with respect to the substrate. The "+X scan" is to move the substrate from the lower energy fluence to the higher energy fluence along the X-axis. The "-X scan" is in the direction reverse to the "+X scan". The energy fluence is defined by an average value between the lower and higher values. The micro-crystal generation level energy fluence can be schematically defined as in FIG. 8.

FIG. 9 shows experimental data carried out by the inventors under the following conditions:

Substrate Size: 300 mm×400 mm

Film Layer Structure: Glass Substrate/SiNx/a-Si

Fluence Range: 380 mJ/cm$^2$ through 430 mJ/cm$^2$

Atmosphere: Nitrogen Gas with the Normal Atmosphere Pressure

Laser Irradiation: 35 $\mu$m Pitch (10-Time Irradiation)

Laser Repetition Frequency: 300 Hz

Substrate Temperature: Room Temperature

Substrate Washing: No Washing before Laser Annealing

Quite importantly, the inventors have discovered the fact that the -X scan is wider in margin of the energy fluence to cause 0.3 $\mu$m or larger average grain size of poly-crystalline silicon than the +X scan as illustrated in FIG. 9.

SUMMARY OF THE INVENTION

An object of this invention is to provide a method of manufacturing a poly-crystalline silicon film with a substantially uniform grain size.

An object of the present invention is to provide a method of manufacturing a high mobility poly-crystalline silicon film on a glass substrate.

An object of the present invention is to provide a method of manufacturing a poly-crystalline silicon film on a glass substrate in which an effective excimer laser annealing process is carried out in accordance with an optimum choice of a moving direction of the laser beams relative to the substrate.

An object of the invention is to provide a method of mass-producing a poly-crystalline silicon film used for a driver circuit integrated type liquid crystal display device or for a high performance liquid crystal display device.

The inventors have experimentally tested laser anneal processes to make amorphous silicon films on a glass substrate into poly-crystalline silicon films and have analyzed the poly-crystalline films in greater detail. They have extensively investigated laser annealing processes under burst irradiation states with the relative position between the laser beams and the substrate fixed. As a result, they have discovered that the grain distribution in the poly-crystalline silicon is correlated with a moving direction of the substrate relative to the laser beams.

A first aspect of this invention is to provide a method of manufacturing a poly-crystalline silicon film which includes the steps of forming an undercoat layer on a glass substrate, depositing an amorphous silicon film on the undercoat layer or on the glass substrate, and annealing the amorphous silicon film by irradiating a pulse laser beam to make the same into poly-crystalline silicon film while moving the glass substrate or the irradiated pulse laser beams in a moving direction.

In order to determine the moving direction of the substrate or the annealing laser beams prior to irradiating the laser beam, laser beam pulses with different energy fluence are applied to different places of the amorphous silicon film on the glass substrate and make the amorphous silicon film into a poly-crystalline silicon film.

An area of the poly-crystalline silicon film is then divided by a reference line into two sections where larger and smaller grain sizes are contained, respectively. Such grain sizes of the poly-crystalline film in the two sections are compared. The moving direction is determined in accordance with results obtained from the comparing step. The glass substrate, for instance, is moved in the moving direction taken from the smaller grain size section to the other larger grain size one.

The moving direction may be determined after performing the above acts on more than one amorphous silicon film.

A second aspect of the present invention is characterized in the step of applying one pulse laser beam at a time to the amorphous silicon film on the glass substrate. The applied pulse laser beam is varied from lower energy fluence through higher energy one. The pulse laser beam applied area is divided into two sections by the reference line perpendicular to the moving direction.

Further, the comparing step starts comparing the average grain sizes in the two sections caused by the pulse laser beam with the lower energy fluence. The step continues comparing the same until the smaller average grain size section is reversed to the larger one and vice versa, by the pulse laser beam with higher energy fluence.

The direction determining step determines the moving direction in which the substrate is moved from the larger grain size section to the smaller grain size section or in which the irradiated laser beams are moved from the smaller grain size section to the larger grain size section. The higher energy fluence in this step, however, is limited to such an extent that it does not cause the reversed grain size sections. The irradiating step irradiates the annealing pulse laser beams while moving the substrate or the annealing beams in the moving direction.

A third aspect of the invention is characterized in the pulse laser beam applying step in which the pulse laser beam is rectangular in shape on the substrate and the shorter axis of the rectangular pulse laser beam is substantially in parallel with the moving direction of the glass substrate.

The pulse laser beam applying step also applies one pulse laser beam at a time to the amorphous silicon film on the glass substrate. The pulse laser beam is varied from lower energy fluence through higher energy one. The pulse laser beam applied area is divided into two sections by the reference line perpendicular to the moving direction.

Further, the comparing step starts comparing the average grain sizes in the two sections caused by the pulse laser beam with the lower energy fluence. The step continues comparing the same until the smaller average grain size section is reversed to the larger one, and vice versa, by the pulse laser beam with higher energy fluence.

The direction determining step determines the moving direction in which the substrate is moved from the larger grain size section to the smaller grain size section with higher energy fluence, or in which the annealing laser beams are moved from the smaller grain size section to the larger grain size section. The higher energy fluence, however, is limited to such an extent that it does not cause the smaller grain size section to be reversed to the larger grain size one, and vice versa. The irradiating step irradiates the annealing laser beams while moving the substrate or the annealing laser beams in the moving direction.

A fourth aspect of the invention is characterized in the pulse laser beam applying step in which the pulse laser beam is rectangular in shape on the glass substrate and the shorter axis of the rectangular pulse laser beam is substantially in parallel with the moving direction of the glass substrate.

Further, the pulse laser beam applying step applies one pulse laser beam at a time to the amorphous silicon film on the glass substrate. The pulse laser beam is varied from lower energy fluence through higher energy fluence. The pulse laser beam applied area is divided into two sections by the reference line perpendicular to the moving direction.

The comparing step starts comparing the average grain sizes in the two sections caused by the pulse laser beam with the higher energy fluence and continues doing the same until the larger average grain size section is reversed to the smaller average grain size, and vice versa, by the pulse laser beam with lower energy fluence.

The direction determining step determines the moving direction for the substrate to move from the smaller grain size section to the larger grain size section. The lower energy fluence in this step, however, is limited to such an extent that it does not cause the reversed grain size sections. The annealing laser pulse may be moved instead of the substrate but its moving direction is reverse to that of the substrate. The irradiating step irradiates the annealing laser beams while the substrate or the annealing laser beams are moved in its moving direction.

A fifth aspect of the invention is characterized in the pulse laser beam applying step in which the pulse laser beam is rectangular in shape on the glass substrate and the shorter axis of the rectangular pulse laser beam is substantially in parallel with the moving direction.

Further, the pulse laser beam applying step applies one pulse laser beam at a time to the amorphous silicon film on the glass substrate. The pulse laser beam is varied from lower energy fluence through higher energy fluence. The pulse laser beam applied area is divided into two sections by the reference line perpendicular to the moving direction.

The comparing step starts comparing the average grain sizes in the two sections caused by the pulse laser beam with the lower energy fluence and continues doing the same until the smaller average grain size section is reversed to the larger average grain size, and vice versa, by the pulse laser beam with higher energy fluence.

The direction determining step determines the moving direction in which the substrate is moved from the larger grain size section to the smaller grain size section with higher energy fluence, or in which the annealing laser beams are moved from the smaller grain size section to the larger grain size section. The higher energy fluence, however, is limited to such an extent that it does not cause the smaller grain size section to be reversed to the larger grain size one, and vice versa. The irradiating step irradiates the annealing laser beams while the substrate or the annealing laser beams are moved in the moving direction.

A sixth aspect of the invention is characterized in the pulse laser beam applying step in which the pulse laser beam is rectangular in shape on the substrate and the shorter axis of the rectangular pulse laser beam is substantially in parallel with the moving direction of the glass substrate or the annealing laser beams.

Further, the pulse laser beam applying step applies one pulse laser beam at a time to the amorphous silicon film deposited on the glass substrate. The pulse laser beam is varied from lower energy fluence through higher energy one. The pulse laser beam applied area is divided into two sections by the reference line perpendicular to the moving direction.

The comparing step starts comparing the average grain sizes in the two sections caused by the pulse laser beam with the lower energy fluence and continues doing the same until the larger average grain size section is reversed to the smaller one, and vice versa, by the pulse laser beam with higher energy fluence.

The direction determining step determines the moving direction for the substrate to move from the larger grain size section to the smaller grain size section with the higher energy fluence. However, the higher energy fluence in this step is limited to such an extent that it does not cause the reversed grain size sections. The annealing laser beams may be moved instead of the substrate but its moving direction is reverse to that of the substrate. When a 0.1 $\mu$m or smaller average grain size crystal is detected in the smaller grain size section after the moving direction has been determined, the applied laser beam is again adjusted in shape and energy fluence to avoid it and the moving is also checked. The irradiating step then irradiates the annealing laser beams while the substrate or the annealing laser beams are moved in its moving direction.

A seventh aspect of the invention is characterized in the pulse laser beam applying step in which the pulse laser beam is rectangular in shape on the glass substrate and the shorter axis of the rectangular pulse laser beam is substantially in parallel with the moving direction of the glass substrate or the annealing laser beams.

The pulse laser beam applying step applies one pulse laser beam at a time to the amorphous silicon film deposited on the glass substrate. The pulse laser beam is varied from higher energy fluence through lower energy one. The pulse laser beam applied area is divided into two sections by the reference line perpendicular to the moving direction.

Further, the comparing step starts comparing average grain sizes in the two sections caused by the pulse laser beam with the higher energy fluence and continues doing the same until the larger average grain size section is reversed to the smaller average grain size, and vice versa, by the pulse laser beam with lower energy fluence.

The direction determining step determines the moving direction for the substrate to move from the larger grain size section to the smaller grain size section with the higher energy fluence. However, the higher energy fluence in this step is limited to such an extent that it does not cause the reversed grain size sections. The annealing laser beams may be moved instead of the substrate but its moving direction is reverse to that of the substrate. When 0.1 $\mu$m or smaller average grain size crystals, however, are detected in the larger grain size section after the moving direction has been determined, the applied laser beam is again adjusted in shape and energy fluence to avoid it. The moving direction is also checked again. The irradiating step irradiates the annealing laser beams while the substrate or the annealing laser beams are moved in its moving direction.

An eighth aspect of the invention is to provide a method of manufacturing a poly-crystalline silicon film which includes steps of forming an undercoat layer on a glass substrate, depositing an amorphous silicon film on the undercoat layer or on the glass substrate, and annealing the amorphous silicon by irradiating an excimer laser beam to make the same into poly-crystalline silicon film while the glass substrate or the annealing laser beams are moved in a moving direction.

The method further includes the steps of measuring an intensity profile of the laser beam in the moving direction by using a fluorescent plate or a charge-coupled device to locate a plateau of the intensity profile, dividing the plateau into two portions, comparing heights of the plateaus in the two portions, and determining the moving direction for the substrate to move from the higher plateau portion to the lower plateau portion. The annealing laser beams may be moved instead of the substrate but its moving direction is reverse to that of the substrate.

A ninth aspect of the invention is an improvement to the method of the eighth aspect of the invention. The improvement is characterized in the pulse laser beam applying step in which the pulse laser beam in this step is rectangular in shape on the substrate and the shorter axis of the rectangular pulse laser beam is substantially in parallel with the moving direction of the glass substrate or the annealing laser beams.

A tenth aspect of the invention is to provide a method of manufacturing a poly-crystalline silicon film which includes the steps of forming an undercoat layer on a glass substrate, depositing an amorphous silicon film on the undercoat layer or on the glass substrate and annealing the amorphous silicon by irradiating an annealing excimer laser beam to make the same into poly-crystalline silicon film while the glass substrate or the annealing laser beam are moved in a moving direction.

The method further includes the steps of measuring an intensity profile of the laser in the moving direction by using a fluorescent plate or a charge-coupled device to locate a plateau in the intensity profile, dividing the plateau into two portions, comparing heights of the plateaus in the two portions, determining the moving direction taken from the higher plateau portion to the lower plateau portion, and using an excimer laser beam of substantially no higher intensity components to be mixed in the lower plateau portion for the annealing excimer laser beam.

An eleventh aspect of the invention is an improvement to the method of the tenth invention. The improvement is characterized in the pulse laser beam applying step in which the pulse laser beam is rectangular in shape on the substrate and the shorter axis of the rectangular pulse laser beam is substantially in parallel with the moving direction.

The above-stated and other objects and advantages of the invention will become apparent from the following description when taken with the accompanying drawings. It will be understood, however, that the drawings are for purposes of illustration and are not to be construed as defining the scope or limit of the invention, reference being had for the latter purpose to the claims appended hereto.

EXPLANATION OF THE PREFERRED EMBODIMENT

Figure 1:
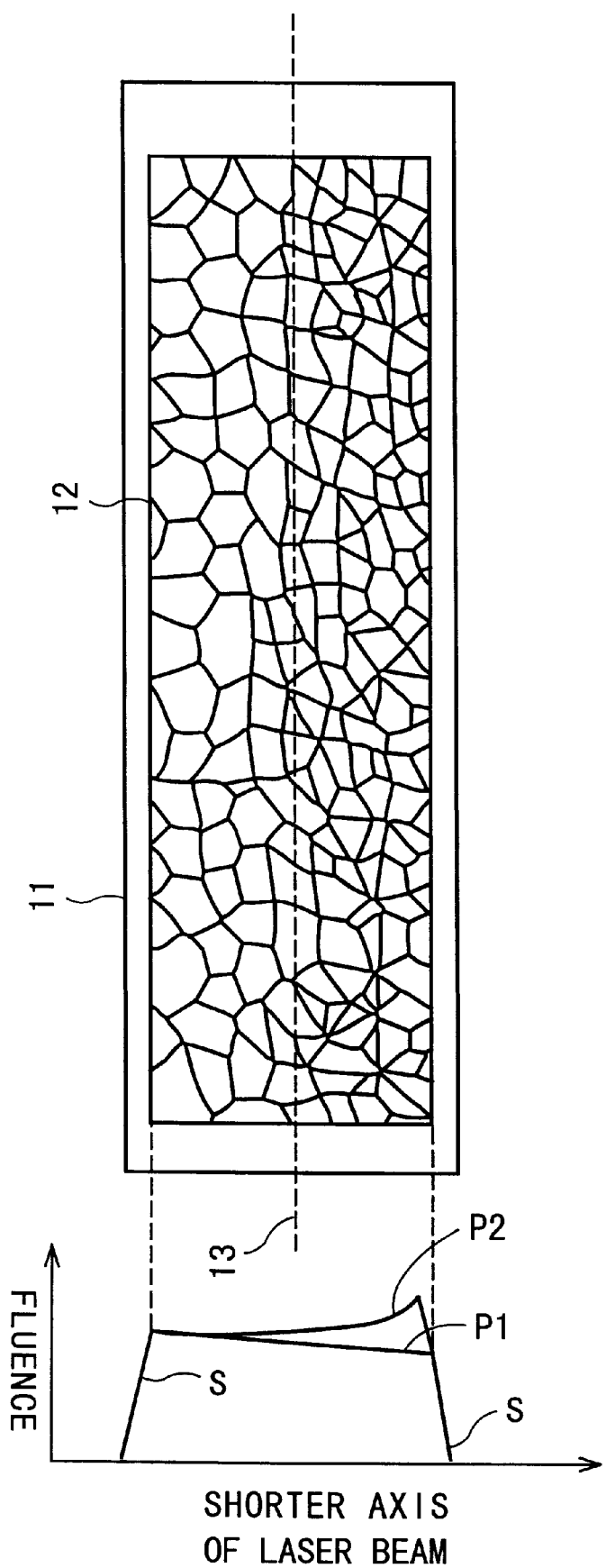
FIG. 1(a) is an energy fluence profile of a laser beam.
FIG. 1(b) is a schematic plan view of grain sizes of poly-crystalline silicon made by the laser beam shown in FIG. 1(a)

With the structures set forth above, taken along X- and Y-axes the moving direction of the substrate relative to the annealing laser beam and the energy fluence, respectively, the intensity distribution of the pulse laser beams applied to the amorphous silicon (a-Si) films is plotted and trapezoidal or rectangular in shape on the glass substrate as shown in FIG. 1(a). The flat region and the rising and falling regions at the edges are called the plateau "P(P1)" and the steepness "S", respectively, in the specification.

Generally, the optical system is adjusted to make the intensity in the plateau P substantially uniform regardless of locations. The intensity is, however, actually weaker at either the front or the rear end with respect to the substrate moving direction. It is because the intensity resolution of a measurement apparatus, such as a charge coupled device (CCD) profiler to measure the intensity distribution of the laser beams, is 5% so that it cannot detect the intensity of less than 5%. Where the laser beams are adjusted in this way and are used to anneal an amorphous silicon film, the laser beam energy observed at a point on the substrate is gradually varied from a weaker level to a stronger one, or vice versa.

Figure 6:
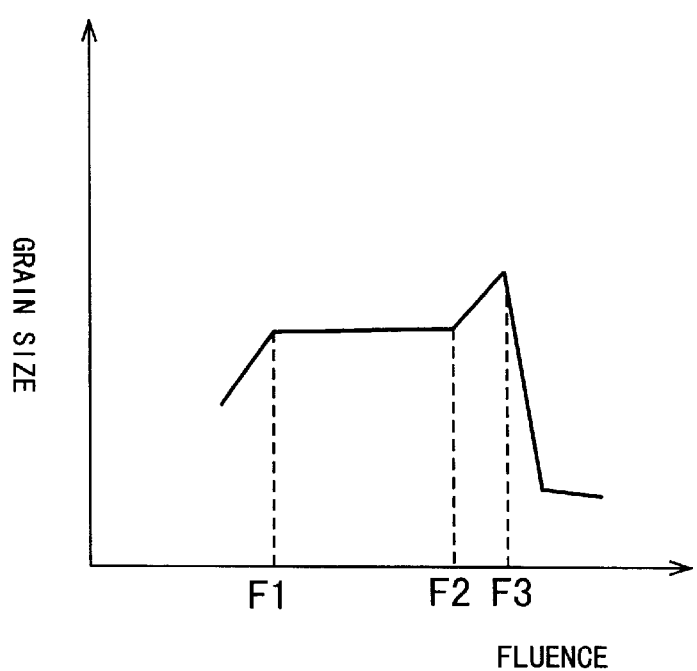
FIG. 6 shows the relationship between energy fluence of the laser beam and grain sizes.
Figures 7, 8:
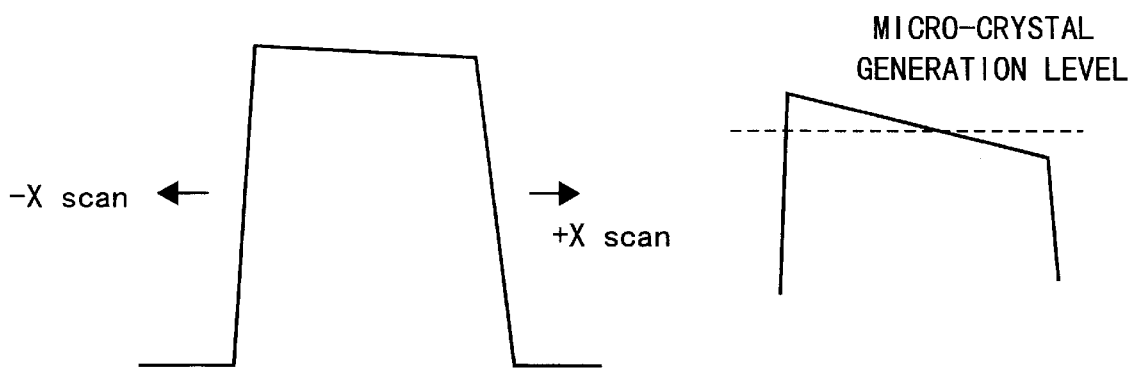
FIG. 7 shows an energy fluence profile of the laser beam and moving directions of a glass substrate relative to the laser beam.
FIG. 8 shows a schematic energy fluence profile of a micro-crystal generation level.

In the event that a fluence F3 laser beam is used to generate micro-crystalline silicon as set forth above with reference to FIG. 6, and which occurs between the stronger and weaker laser energy beams on the plateau P, the micro-crystalline silicon grows at the portions to which a stronger energy beam is applied while poly-crystalline silicon with larger grain sizes grows at the portions to which weaker energy beam is applied.

An ordinary laser annealing process includes an overlapped scanning method in which the substrate is moved up to a length equivalent to 5% of the laser beam width. In this case, the laser beams are applied 20 times to a point on the substrate. Where the laser annealing is carried out with the overlapped scanning method in which the fluence F3 to generate micro-crystalline silicon is set in the middle of the range between the stronger and weaker beams and the substrate is moved in a direction from the weaker beam to the stronger one, poly-crystalline silicon with larger grain sizes grows in the first half of 20 times and micro-crystalline silicon grows in the latter half. As a consequence, the micro-crystalline silicon remains so that high performance TFTs are not realized.

Figure 9:
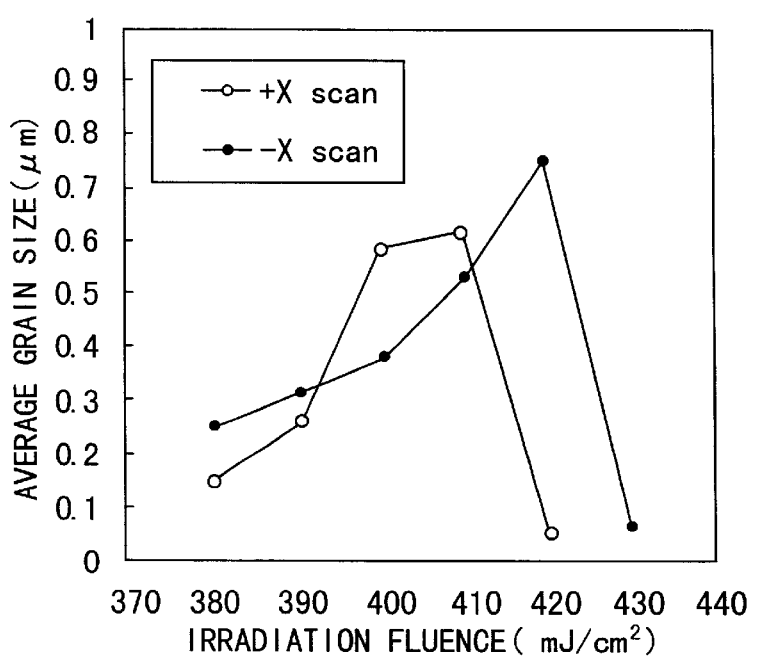
FIG. 9 shows the relationship between average grain sizes and energy fluence of the laser beam.

As a laser annealing method for poly-crystalline silicon TFTs, its laser annealing fluence is adjusted to be less than F3 and be ordinarily of intensity between F1 and F2 shown in FIG. 6. In practice, however, F2 is very close to F3 as shown in FIG. 9. Further, the oscillation intensity of pulse laser beams fluctuates in the range of ±10%. Therefore, even though the laser annealing fluence is set to be of the intensity between F1 and F2, some of the applied laser beams are stronger in energy by +10% than the set value, i.e., stronger than F3.

In the case that the substrate moving direction is set to be consistent with a direction from the weaker beam to the stronger one, micro-crystalline and poly-crystalline silicon are formed by the laser beam with energy fluence larger than F3 in the region where those +10% stronger beams are applied. Since the next laser beams are applied to a different region, the laser beams are not applied to the region where the overlapped scanning is not carried out. As a result, TFTs with poor characteristics are partially formed and defects are found in the TFTs for driver circuits and pixels.

Where the substrate movement is in the direction reversed to the one set forth above, i.e., the direction taken from the stronger beams to the weaker ones and the annealing energy fluence is set as in the above-mentioned case, the +10% stronger beams are applied to regions and micro-crystalline silicon is formed in the regions. The stronger beams, however, are applied there in the initial scanning period. The weaker beams are then followed so that the micro-crystalline silicon is melted, reactivated and returned to poly-crystalline silicon with ordinary grain sizes. Therefore, the formed TFTs are not of partially poor characteristics but are of entirely high performances on the substrate.

As explained above, where the substrate moving direction in a laser annealing process is taken from the stronger beams to the weaker ones in the plateau region, TFTs with high performances are obtained. It is noted, however, that a beam profiler cannot detect the plateau region P of rectangular beams in the case that the beam are less different in intensity than 5%. Even in this case, the intensity difference between the laser beams can be detected, if a laser annealing process is carried out for an amorphous silicon deposited substrate without moving the substrate and the laser annealed region is divided into two sections along the shorter axis of the laser beams to compare average grain sizes in the two sections. More particularly, the grain sizes of poly-crystalline silicon in the laser annealed region are in proportion to the magnitude of fluence. The average grain size in the lower fluence region is smaller while that in the higher fluence region is larger. The intensity difference in the plateau P can be judged from such comparisons of the average grain sizes. The substrate moving direction is properly determined to be taken from the stronger beams to the weaker ones.

DESCRIPTION OF THE PREFERRED EMBODIMENT

The first embodiment of the present invention will be explained hereinafter with reference to the attached drawings.

Embodiment 1

The laser annealing process without moving a glass substrate, not shown, is applied to a region 11 in FIG. 1(b) where a-Si films have been deposited on the substrate. That is to say, a pulse-like laser beam is applied only once to the region. The surface situation of the p-Si film is visible as shown in FIG. 1(b) when the film is etched in Secco's solution. The excimer laser beam size is approximately 200 mm×0.4 mm (the longer and shorter axes of the laser applied region 11, respectively), although the shorter axis along the substrate moving direction is enlarged for the sake of easy understanding.

The laser applied region 11 indicates all the area where the a-Si films have been made into the p-Si films. The region 12 represents the plateau. The Secco's etching of the region 11 provides visualization of the grain sizes of p-Si films in the plateau region 12. The region 11 is divided into two sections at a reference line 13 perpendicular to the glass substrate moving direction. The upper half of the region 12 has larger grain sizes. An average grain size in each divided region by the line 13 is obtained from the grain distributions. There are many methods of calculating the average grain size. A computer software used in this embodiment is Image-Pro® Plus, Version 1.2 for Windows™, Media Cybernetics, 8484 Georgia Avenue, Silver Spring, Md. 20910, U.S.A., which analyzes distance from the center of gravity in each crystal in a designated region. This software can be applied to figure out the average grain size of the crystal and also its statistical average.

The region 12 is divided into two sections by the line 13 perpendicular to the axis along the substrate moving direction. The average grain size of the P-Si in each divided section is calculated with the software. As a result, the average grain size in the upper half section is 0.2 $\mu$m and that in the lower one is 0.15 $\mu$m.

This operation is carried out for regions where laser beams are applied in accordance with sequentially increased fluence. In particular, the fluence is successively increased to shift the plateau P1 to an upper position shown in FIG. 1(a).

The grain size difference in the sections on both sides of the line 13 shown in FIG. 1(b) is not found in the section to which very low fluence laser beams are irradiated. The grain size difference becomes more distinctive in the sections as the fluence of the applied laser beams becomes higher. Thus, the comparison between grain sizes can be done in the above-mentioned way.

Further, when much higher energy fluence beams are applied to the regions, it is observed that the grain size distribution in the sections becomes reversed to that shown in FIG. 1(b) on both sides of the line 13. This is because excessive cooling takes place with melted silicon in the regions of the higher energy fluence within the plateau. Thus, micro-crystalline silicon is formed so that its grain size becomes extremely small.

Yet further, when the fluence is higher than in the previous cases, the micro-crystalline silicon is observed in the sections on both sides of the dividing line 13, i.e., substantially through the regions of laser irradiation. Thus, the average grain size in the upper half section is not significantly different from that in the lower half section.

In this embodiment, the energy fluence is changed one after another to such an extent that the micro-crystalline silicon is almost made in either one of the sections on both sides of the dividing line 13. The average grain size in each one of the sections is calculated at every intensity of fluence. The average grain size in the upper half section is compared with that in the lower half section. The substrate moving direction is decided in such a direction as taken from the section of the larger grain size to that of the smaller grain size. In the case shown in FIG. 1(b), for instance, the substrate is moved in the direction taken from the upper section to the lower one.

Figure 2:
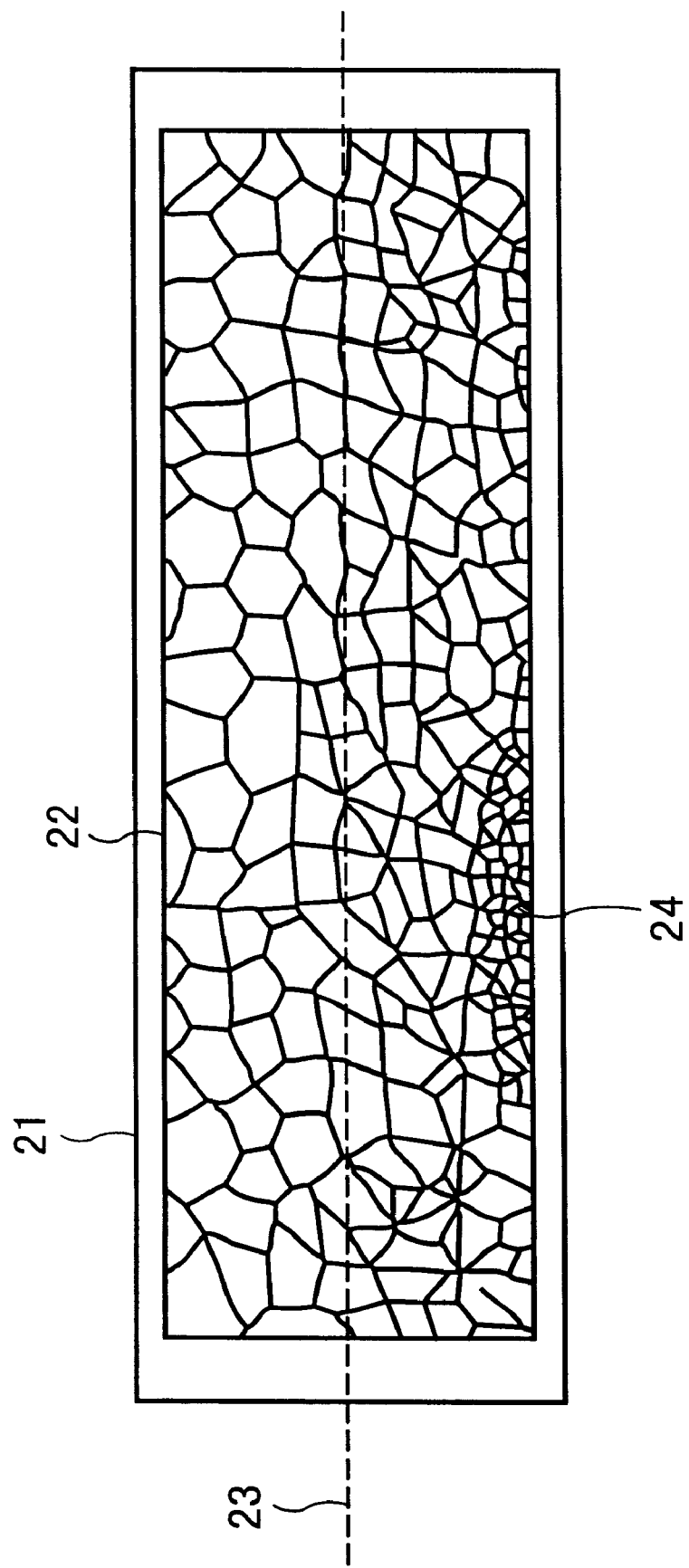
FIG. 2 is a schematic plan view of grain sizes of poly-crystalline silicon and micro-crystalline silicon made by a laser beam which has higher energy fluence than that shown in FIG. 1(a)

As shown in FIG. 2, a micro-crystalline portion 24 with much smaller grain sizes sometimes appear in the small grain size section of the two sections into which a plateau region 22 in a laser beam applied region 21 is divided by a dividing line 23. This is because the beam energy is so high in the lower half section of the plateau region that quite smaller grain sizes of micro-crystalline silicon 24 are formed there. In this case, the laser beam fluence in the plateau region 22 is such a plateau P2 as shown in FIG. 1(a), i.e., extremely higher energy beams are applied at the front edge of the substrate moving direction.

In this situation, when the laser annealing process is carried out for the a-Si film deposited substrate which is moved in the direction taken from the larger grain size section to the smaller grain size one, micro-crystalline silicon is made in such a region at every beam irradiation. Since the next laser beam is not applied to that region, p-Si films with low electron mobility under electric fields is partially made there. If TFTs are formed by using the p-Si films, defects take place with driver circuits and pixel TFTs. Where the micro-crystalline silicon 24 is made at the front edge of laser beams corresponding to the front end portion of the glass substrate carrying direction, the optical system and plateau P1 are adjusted in order for the laser beams to make such a crystal distribution as in FIG. 1(b). The test is there after carried out again for determination of a proper substrate moving direction as explained above.

Embodiment 2

Laser beams are applied to anneal an a-Si film deposited substrate without moving the substrate in the way similar to the Embodiment 1. Crystalline grain sizes are observed as the laser beams Are varied from higher fluence to lower one. If the fluence is set to be extremely high, micro-crystalline silicon with smaller grain sizes than 0.1 $\mu$m is formed almost all over the laser irradiated region and there is no significant difference with grain sizes in the sections on both sides of the line 13.

Next, the grain size observation is performed with the fluence lowered. A larger grain size region is observed in one of the sections at some lower fluence. If the laser beams have such energy distribution in the plateau as shown in FIG. 1(a), for instance, it means irradiated laser beam fluence in which that the upper half of the plateau has the energy to generate micro-crystalline silicon while the lower half thereof has that to make larger grain size p-Si.

Then, yet lower fluence is set so that the energy in the upper half of the plateau is approximately equal to that in the lower half. The observation shows that the laser beam irradiated region is substantially the same grain size distribution as in FIG. 1(b). This is because the grain size in the upper half section becomes large, the irradiated laser beams in the lower half section have the energy to make the grain size smaller than in the upper half, and the grain size distributions on both sides of the divided line 13 are reversed with respect to the substrate moving direction as set forth above. The grain size distributions of the laser beam irradiated region have been analyzed in the same method as in the Embodiment 1 just before the occurrence of such a reverse. It has been found that the average grain size in the upper half of the plateau is 0.1 $\mu$m because the upper half still has the energy to make micro-crystalline silicon, and that the average grain size in the lower half of the plateau is 0.2 $\mu$m because the lower half has the lower energy to make the grain size larger than the micro-crystalline silicon.

In this Embodiment 2, the fluence is varied from higher value to lower one. In response to the fluence, the laser beam irradiated region is divided into larger and smaller grain size sections on both sides of the divided line 13 and, then, the grain sizes in those sections are reversed. The average grain sizes therein are calculated and compared to each other in that range of fluence. The substrate moving direction is determined in accordance with such comparison data, i.e., the direction is taken from the smaller average grain size section by the higher energy in the plateau to the larger one with the lower energy therein.

If micro-crystalline silicon, however, appears at the edge of the larger grain size section in the half way through the manufacturing process, the micro-crystalline poly-silicon remains in each laser beam irradiated region. It is because the laser annealing is carried out in the direction taken from the smaller average grain size section to the larger average grain size one. In this case, the optical system is adjusted to make the laser beam shaped in order to obtain such a crystal distribution as in FIG. 1(b) and the method set forth above in Embodiment 2 is repeated to determine the substrate moving direction.

Embodiment 3

In this Embodiment 3, the intensity profile of laser is analyzed by a profiler using a fluorescent plate or a charge coupled device (CCD) and the substrate moving direction is determined in accordance with its result.

The plateau region is analyzed by the CCD profiler. The plateau region is divided into two sections to compare heights of the divided plateau therein. The higher and lower portions of the plateau are detected so that the substrate moving direction is taken from the higher portion of the plateau to the lower one. Since, for instance, the left portion of the plateau P1 in FIG. 1(a) (the upper section of the region 12 in FIG. 1(b)) is slightly higher than the right portion, the substrate moving direction is determined to be taken from the left portion to the right one.

Figure 3:
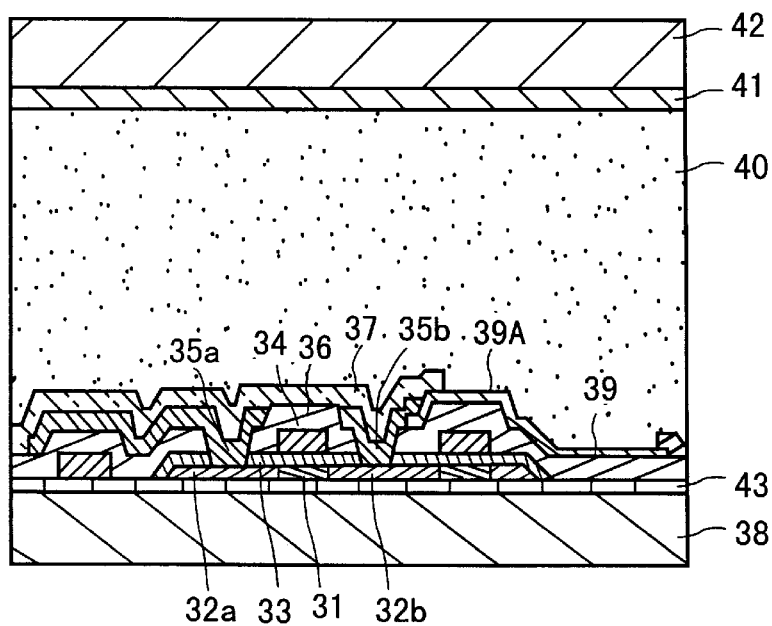
FIG. 3 is a sectional view of the structure of a liquid crystal display device.
Figure 4:
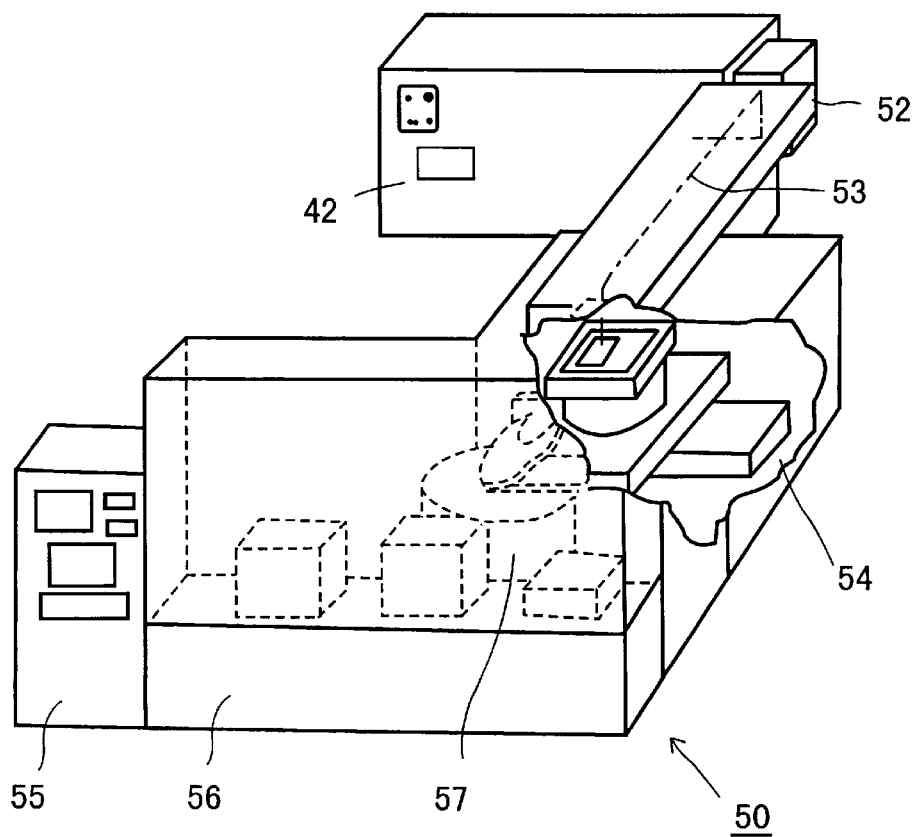
FIG. 4 is a partial cut-out perspective view of a polycrystalline silicon manufacturing apparatus.
Figure 5:
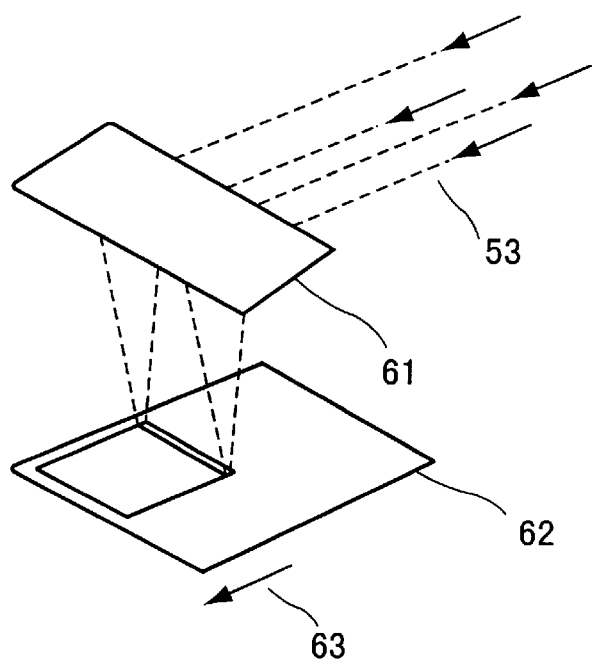
FIG. 5 is a schematic perspective view of a laser annealing system used in the manufacturing apparatus shown in FIG. 4.

Next, a method of making a TFT array is explained hereinafter with reference to FIG. 3. In order to drive a liquid crystal display device, the TFT array is made of a p-Si film manufactured on a glass substrate by using a method of the present invention.

An undercoat layer 43 consisting of SiNx and SiOx is formed on a glass substrate 38 by a plasma enhanced chemical deposition (PECVD) process. The size of the glass substrate 38 is 400 mm×500 mm. A 55 nm thick a-Si film is then also deposited by the PECVD process.

The a-Si film is heat-processed for one hour at 500° C. of Nitrogen atmosphere to reduce Hydrogen density in the film. The a-Si film thickness is measured by ellipsometry. Its actual value has been 54.5 nm.

An XeCl excimer laser annealing process is applied to the a-Si film and makes the same into a p-Si film 31. The irradiated laser is a linear beam of 200 mm×0.4 mm. The fluence on the glass substrate 38 is 350 mJ/cm$^2$. Two successive laser beams are overlapped at 98% by moving the glass substrate 38. The laser operates at 300 Hz. The XY stage carrying the substrate is moved at 6 mm/s in such a direction as determined in accordance with the method of Embodiment 1.

A photolithography is applied to the p-Si film 31 to make a p-Si source 32a and a p-Si drain 32b therein. A gate oxide layer 33 and a gate electrode 34 are formed in turn on them to make a thin film transistor.

The p-Si source 32a, the p-Si drain 32b, the gate oxide layer 33 and the gate electrode 34 are entirely covered by an insulation layer 36. Contact holes are perforated so that a source electrode 35a and a drain electrode 35b are connected to the p-Si source 32a and the p-Si drain 32b through the holes, respectively. The source and drain electrodes 35a and 35b and the insulation layer 36 are covered by a protection layer 37.

Adjacent to the thin film transistor portion, a conductive layer 39A connected to the drain electrode 35b and a pixel electrode 39 are provided for a TFT array substrate.

A counter electrode 41 and a counter substrate 42 are provided opposite to the TFT array substrate. A liquid crystal material 40 is held between the TFT array substrate and the counter electrode 41. An active matrix-type liquid crystal display device is, thus, manufactured. According to the present invention, since a grain size distribution in the P-Si film is substantially uniform and appropriate, the TFTs have excellent characteristics and are manufactured at very high yield rate. A high quality liquid crystal display device can be manufactured.

According to the present invention, TFTs with high carrier mobility under an electric field are uniformly manufactured on the entire surface of a glass substrate. The method of manufacturing a poly-crystalline silicon in accordance with the present invention can advance the experimental stage of a high performance liquid crystal display device to its practical stage.

What we claim is:

1. A method of manufacturing a poly-crystalline silicon film, comprising:

preparing an amorphous silicon film;

irradiating a preliminary laser beam from a laser annealing apparatus onto said amorphous silicon film to convert said amorphous silicon film into the poly-crystalline silicon film, said poly-crystalline film including a plurality of sections having different grain sizes;

comparing a first average grain size in a first section of the poly-crystalline silicon film to a second average grain size in a second section of the poly-crystalline film to determine which section has a larder or smaller average grain size;

determining, based on the comparing, a moving direction of an annealing laser beam from said laser annealing apparatus in relation to a subsequent amorphous silicon film in accordance with results obtained from said comparing of said average grain sizes of the poly-crystalline film; and controlling said moving direction of said annealing laser beam in relation to said subsequent amorphous silicon film to anneal a desired section of said subsequent amorphous silicon film, wherein the moving direction is selected in order to affect the average grain sizes of the desired section.

2. The method of manufacturing a poly-crystalline silicon film according to claim 1, further comprising setting said moving direction in a direction that is substantially parallel to a shorter axis of the preliminary laser beam that is substantially rectangular in shape.

3. A method of manufacturing a poly-crystalline silicon film according to claim 1:

wherein said first and second sections are divided by a reference line.

4. A method of manufacturing a poly-crystalline silicon film, comprising:

preparing an amorphous silicon film;

measuring an intensity profile of an excimer laser beam by using a fluorescent plate or a charge-coupled device to locate a plateau of the intensity profile;

dividing the plateau into two portions;

comparing heights of the plateau in the two portions;

determining a moving direction in which said amorphous silicon film is moved from a higher plateau portion to a lower plateau portion in relation to said excimer laser beam; and irradiating said excimer laser beam onto said amorphous silicon film while said amorphous silicon film is moved in the moving direction in order to convert said amorphous silicon film into said poly-crystalline silicon film.

5. The method of manufacturing a poly-crystalline silicon film according to claim 4:

wherein said excimer laser beam has a substantially rectangular shape and said moving direction is substantially parallel to a shorter axis of the rectangular shaped excimer laser beam.

6. A method of manufacturing a poly-crystalline silicon film, comprising:

preparing an amorphous silicon film;

measuring an intensity profile of an excimer laser beam by using a fluorescent plate or a charge-coupled device to locate a plateau of the intensity profile;

dividing the plateau into two portions;

comparing heights of the plateau in the two portions;

determining a moving direction in which said amorphous silicon film is moved from a higher plateau portion to a lower plateau portion in relation to said excimer laser beam;

adjusting an energy fluence of said excimer laser beam to avoid high intensities in the lower plateau portion which result in the formation of microcrystalline silicon film; and irradiating said adjusted excimer laser beam onto said amorphous silicon film while said amorphous silicon film is moved in the moving direction in order to convert said amorphous silicon film into said poly-crystalline silicon film.

7. The method of manufacturing a poly-crystalline silicon film according to claim 6:

wherein said excimer laser beam have a substantially rectangular shape and the moving direction is substantially parallel to a shorter axis of the rectangular shaped laser beam.

* * * * *